United States Patent [19]
Park

[11] Patent Number: 6,064,092
[45] Date of Patent: May 16, 2000

[54] SEMICONDUCTOR-ON-INSULATOR SUBSTRATES CONTAINING ELECTRICALLY INSULATING MESAS

[75] Inventor: Kyu-charn Park, Songtan, Rep. of Korea

[73] Assignee: Samsung Electronics Co., Ltd., Rep. of Korea

[21] Appl. No.: 09/291,416

[22] Filed: Apr. 13, 1999

Related U.S. Application Data

[62] Division of application No. 08/664,958, Jun. 13, 1996, Pat. No. 5,893,745.

[51] Int. Cl.[7] .................................................. H01L 27/01
[52] U.S. Cl. ........................ 257/347; 257/59; 257/72; 257/330; 257/350; 257/353; 257/355; 257/374
[58] Field of Search ................................. 257/347–355, 257/59, 72, 330, 374

[56] References Cited

U.S. PATENT DOCUMENTS

| | | | |
|---|---|---|---|
| 5,011,783 | 4/1991 | Ogawa et al. | 483/23 |
| 5,438,173 | 8/1995 | Houston | 200/52 R |
| 5,496,764 | 3/1996 | Sun | 438/155 |
| 5,510,640 | 4/1996 | Shindo | 257/347 |

*Primary Examiner*—Fetsum Abraham
*Attorney, Agent, or Firm*—Myers Bigel Sibley & Sajovec

[57] ABSTRACT

Methods of forming semiconductor-on-insulator field effect transistors include the steps of forming an insulated trench containing a semiconductor region therein and an insulating region mesa at a bottom of the trench, so that the semiconductor region has relatively thick regions adjacent the sidewalls of the trench and has a relatively thin region above the mesa. Dopants can then be added to the thick regions to form low resistance source and drain regions on opposite sides of the thin region which acts as the channel region. Because the channel region is thin, low junction capacitance can also be achieved. An insulated gate electrode can also be formed on the face of the semiconductor region, above the channel region, and then source and drain contacts can be formed to the source and drain regions to complete the device. Preferably, the step of forming the trench containing a semiconductor region comprises the steps of patterning an oxidation blocking layer having an opening therein, on a face of a semiconductor substrate, and then oxidizing the substrate at the face to form an electrically insulating region in the opening and adjacent a periphery of the oxidation blocking layer. These steps are performed so that a portion of the electrically insulating region in the opening is thinner than a portion of the electrically insulating region extending adjacent the periphery of the oxidation blocking layer. Next, the oxidation blocking layer is removed from the face of the substrate and then the electrically insulating region is planarized. The planarized insulating region is then used as a substrate by planarizing a back face of the semiconductor substrate until the insulating region is reached. At this point a trench filled with a semiconductor material will remain in the insulating region and this remaining semiconductor material can be used as an SOI substrate.

8 Claims, 4 Drawing Sheets

SEMICONDUCTOR-ON-INSULATOR SUBSTRATES CONTAINING ELECTRICALLY INSULATING MESAS

This is a divisional of Ser. No. 08/664,958 filed Jun. 13, 1996 now U.S. Pat. No. 5,893,745.

FIELD OF THE INVENTION

The present invention relates to semiconductor devices and fabrication methods, and more particularly to methods of fabricating semiconductor-on-insulator devices and devices formed thereby.

BACKGROUND OF THE INVENTION

Electronic devices may be formed on thin-film silicon-on-insulator (SOI) substrates with reduced short channel effects, reduced parasitic and nodal capacitances, increased radiation hardness, reduced susceptibility to parasitic thyristor latch-up and reduced process complexity compared to bulk semiconductor devices. However, SOI devices may have parasitic contact resistances, such as high source and drain contact resistances to SOI MOSFETs.

One attempt to form an SOI MOSFET according to the prior art is disclosed in FIGS. 1A–1D. In particular, to form the structure of FIG. 1A, a buried oxide layer 12 and a silicon layer 14 thereon are formed using a conventional separation by implantation of oxygen (SIMOX) technique which involves implanting oxygen ions into a face of a silicon substrate 10. Then, a pad oxide layer 16, nitride layer 18 and photosensitive patterning layer 20 are sequentially formed. The nitride layer 18 is then patterned to define an active region in the silicon layer 14 using the photosensitive layer 20 as a mask. Field oxide isolation regions 22 are then formed by performing a relatively long and high temperature oxidation of the silicon layer 14 until the silicon layer 14 is consumed, using the patterned nitride layer 18 as a mask, as illustrated by FIG. 1B. The nitride layer 18 is then removed and impurity ions are implanted into the silicon layer 14 to set the threshold voltage. An insulated gate electrode comprising a gate insulating layer 26, polycrystalline silicon and tungsten silicide (WSi$_x$) gate electrode 28 and oxide spacers 30, is then formed on the silicon layer 14. The gate electrode 28 is then used as a mask to form the source region 14a and drain region 14b in the silicon layer 14, as illustrated by FIG. 1C. Conventional steps are then used to deposit an insulating layer 32 and then reflowing boro-silicate glass (BPSG) on the insulating layer 32 to form a planarized layer 34. The planarized layer 34 and insulating layer 32 are then etched to form source and drain contact holes. Source and drain electrodes 36 and 38 are then formed by patterning metallization on the planarized layer 34, as illustrated by FIG. 1D.

Unfortunately, the use of thin-film SOI substrates typically causes an increase in the sheet resistances of the source and drain regions of FETs formed therein and this increase typically causes a decrease in on-state current ($I_{ds}$). These difficulties in using thin-films are more fully disclosed in an article by L. Su et al. entitled *Optimization of Series Resistance in Sub*-0.2 $\mu m$ *SOI MOSFETs*, International Electron Devices Meeting, No. 30.1.1–30.1.4, pp. 723–726. However, the use of thick-film SOI substrates is also problematic because high junction capacitances with the channel region typically result and because sub-threshold leakage current typically increases with the thickness of the silicon film.

Thus, notwithstanding prior art attempts to form SOI substrates and devices, there still continues to be a need for improved methods of forming SOI substrates and devices so that devices formed therein derive the above described benefits of SOI isolation, but do not suffer from high sheet resistances and high junction capacitances associated with thin-film devices.

SUMMARY OF THE INVENTION

It is therefore an object of the present invention to provide improved methods of forming semiconductor-on-insulator substrates and devices, and structures formed thereby.

It is another object of the present invention to provide methods of forming semiconductor-on-insulator substrates and devices having low source and drain sheet resistances and low source and drain contact resistances, and structures formed thereby.

It is still a further object of the present invention to provide methods of forming semiconductor-on-insulator substrates and devices having low junction capacitance between the source and drain regions and the channel region therebetween, and structures formed thereby.

These and other objects, features and advantages of the present invention are provided by methods of forming semiconductor-on-insulator field effect transistors which include the steps of forming an insulated trench containing a semiconductor region therein and an insulating region mesa at a bottom of the trench, so that the semiconductor region has relatively thick regions adjacent the sidewalls of the trench and has a relatively thin region above the mesa. Dopants can then be added to the thick regions to form low resistance source and drain regions on opposite sides of the thin region which acts as the channel region. Because the channel region is thin, low junction capacitance can also be achieved. An insulated gate electrode can also be formed on the face of the semiconductor region, above the channel region, and then source and drain contacts can be formed to the source and drain regions to complete the device.

Preferably, the step of forming the trench containing a semiconductor region comprises the steps of patterning an oxidation blocking layer having an opening therein, on a face of a semiconductor substrate, and then oxidizing the substrate at the face to form an electrically insulating region in the opening and adjacent the oxidation blocking layer. These steps are performed so that a portion of the electrically insulating region in the opening is thinner than a portion of the electrically insulating region extending adjacent the edges of the oxidation blocking layer. Next, the oxidation blocking layer is removed from the face of the substrate and then the electrically insulating region is planarized. The planarized insulating region is then used as a substrate by planarizing a back face of the semiconductor substrate until the insulating region is reached. At this point an insulated trench filled with a semiconductor material will remain in the insulating region. This remaining semiconductor material can then be used as an SOI substrate.

DESCRIPTION OF PREFERRED EMBODIMENTS

Figure 1A:
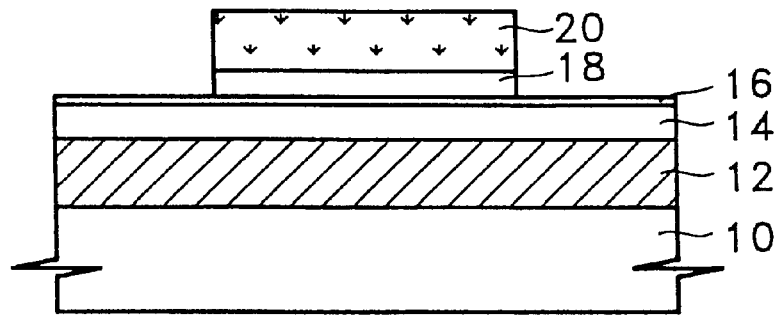
FIGS. 1A–1D illustrate schematic cross-sectional views of intermediate structures illustrating a method of forming a silicon-on-insulator field effect transistor, according to the prior art.
Figure 1B:
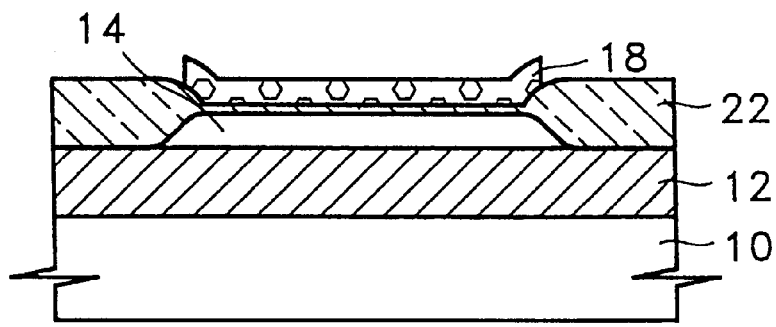
Figure 1C:
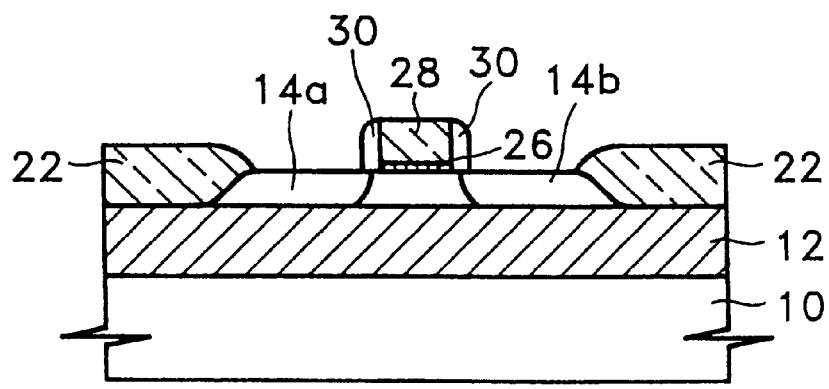
Figure 1D:
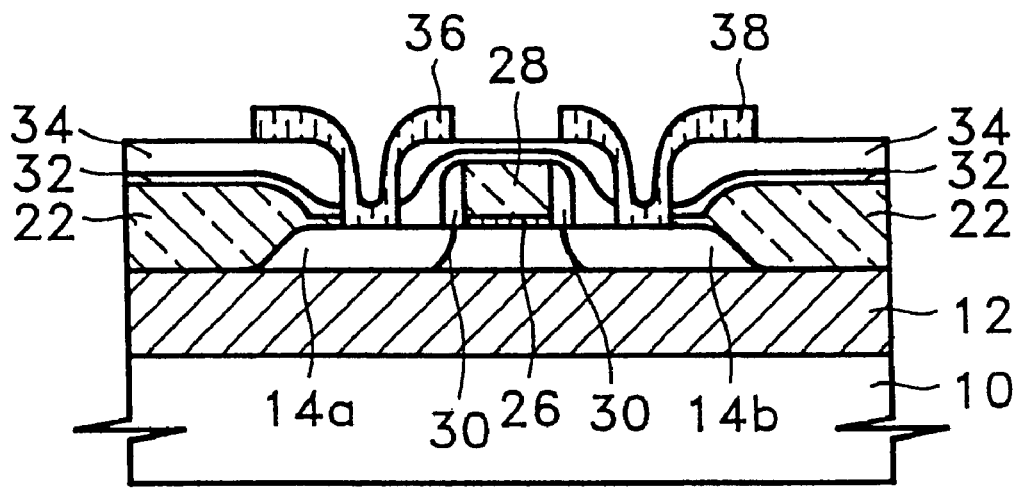
Figure 2:
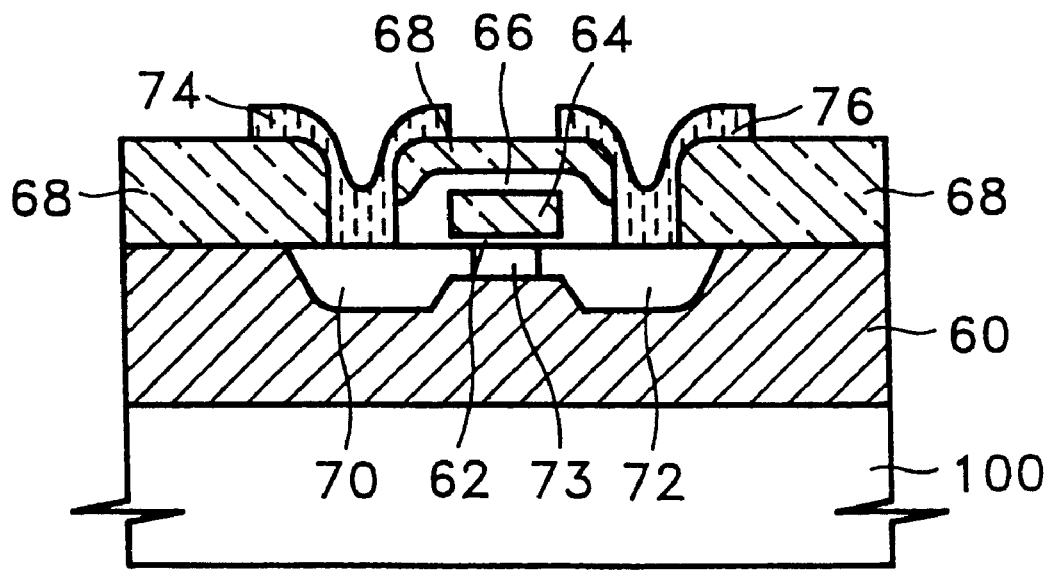
FIG. 2 illustrates a schematic cross-sectional view of a semiconductor-on-insulator field effect transistor according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type, however, each embodiment described and illustrated herein includes its complementary embodiment as well.

Figure 3A:
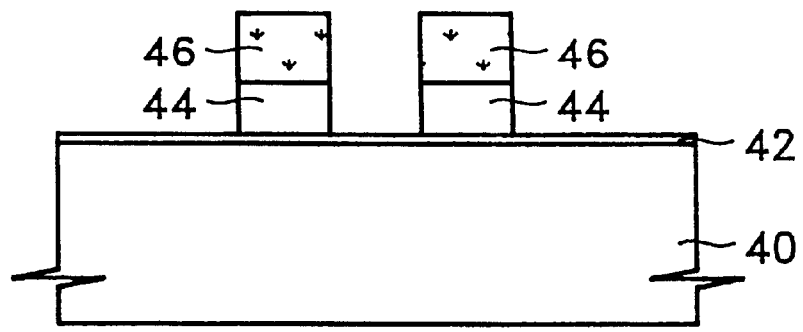
FIGS. 3A–3F illustrate schematic cross-sectional views of intermediate structures illustrating a method of forming the semiconductor-on-insulator field effect transistor of FIG. 2.

Referring now to FIGS. 2 and 3A–3F, a preferred method of forming a semiconductor-on-insulator (SOI) field effect transistor according to the present invention will now be described. In particular, FIG. 3A illustrates initial steps of forming a thin pad oxide layer 42 (e.g., $SiO_2$) on a first face of a semiconductor substrate 40 (e.g., silicon), forming an oxidation blocking layer 44 (e.g., $Si_3N_4$) on the pad oxide layer 42 and then apply and patterning a photosensitive layer 46 to use as a mask during etching (i.e., patterning) of the oxidation blocking layer 44. The patterned oxidation blocking layer 44 may comprise left and right striped-shaped regions of $Si_3N_4$ which extend in a third dimension, not shown.

Figure 3B:
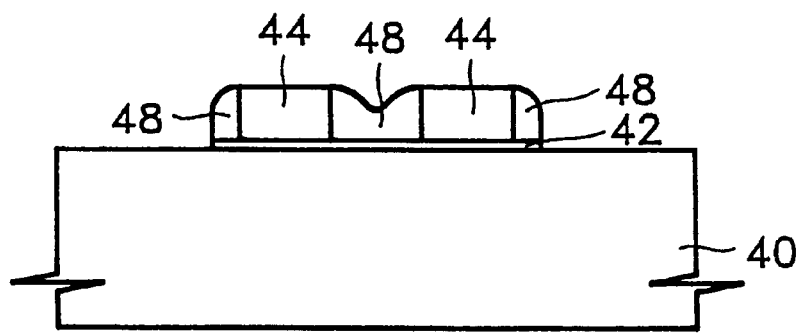
Figure 3C:
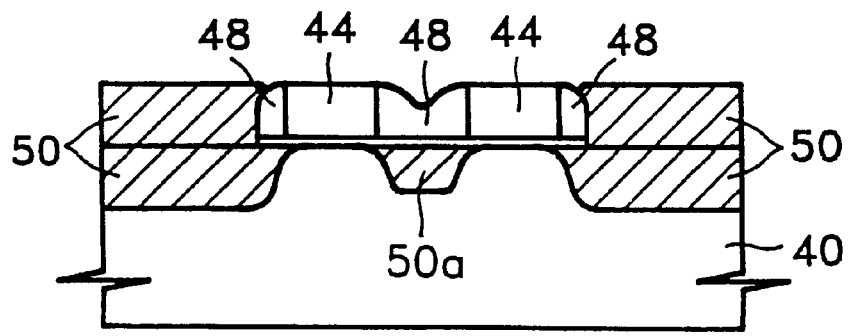

Referring now to FIG. 3B, the photosensitive layer 46 is then removed and followed by the step of forming an oxide spacer 48 in the opening and at the edges of the patterned oxidation blocking layer 44. The oxide spacer forming step preferably comprises the step of forming an oxide layer and then etching the oxide layer back so that an oxide spacer 48 is formed in the opening and on the outside edges or sidewalls of the oxidation blocking layer 44, as illustrated. The oxide layer may be formed by deposition using conventional chemical vapor deposition (CVD) techniques. Thereafter, a thermal oxidation step is performed to form a relatively thick field oxide isolation region 50 in the substrate 40, as illustrated by FIG. 3C. Preferably, the field oxide isolation region 50 is formed to have a nonuniform thickness. This is achieved by using the oxide spacer 48 in the opening to slow down the rate of formation of the field oxide isolation region 50 underneath the oxide spacer 48. Thus, the depth of the center portion 50a of the field oxide isolation region 50 into the substrate 40 is less than the depth of the corresponding outside portions adjacent the edges of the oxidation blocking layer 44.

Figure 3D:
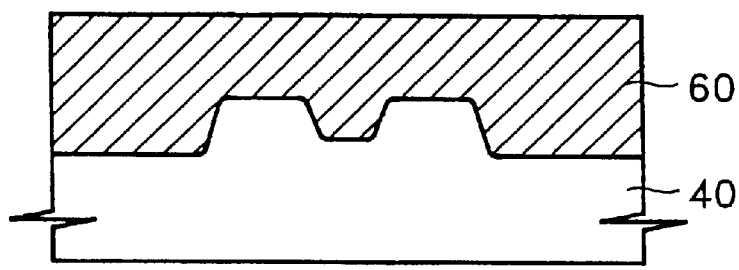
Figure 3E:
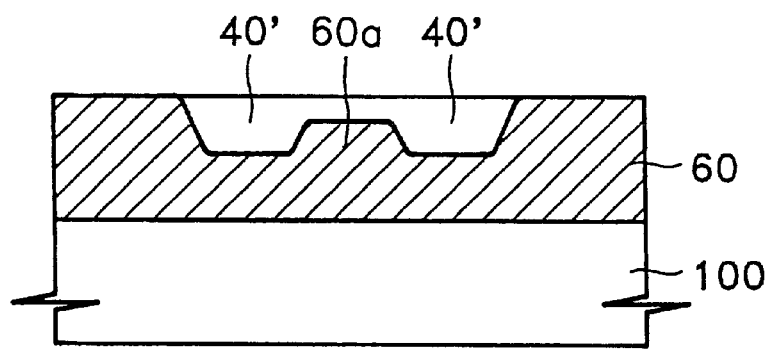

Following the step of forming the field oxide isolation region 50, the oxidation blocking layer 44 is removed and then $SiO_2$ is deposited and planarized using chemical mechanical polishing (CMP), to form the structure illustrated by FIG. 3D having a semiconductor substrate 40 and a planarized electrically insulating layer 60 thereon. The planarized electrical insulating layer 60 is then bonded directly to a handling substrate 100 and then the rear side of the semiconductor substrate 40 is polished down to the electrically insulating layer 60 to form an electrically isolated trench containing a semiconductor region 40'. As illustrated by FIG. 3E, the resulting trench in the electrically insulating layer 60 contains a mesa 60a at a bottom thereof so that the thickness of the semiconductor, as measured between a top of the mesa 60a and the face of the semiconductor region 40' is less than the thickness of the surrounding regions of semiconductor extending adjacent the bottom of the trench. Preferably, the thickness of the semiconductor at the mesa is less than about 1000 Å and the thickness of the semiconductor on either side of the mesa is between about 1000 Å and 3000 Å.

Figure 3F:
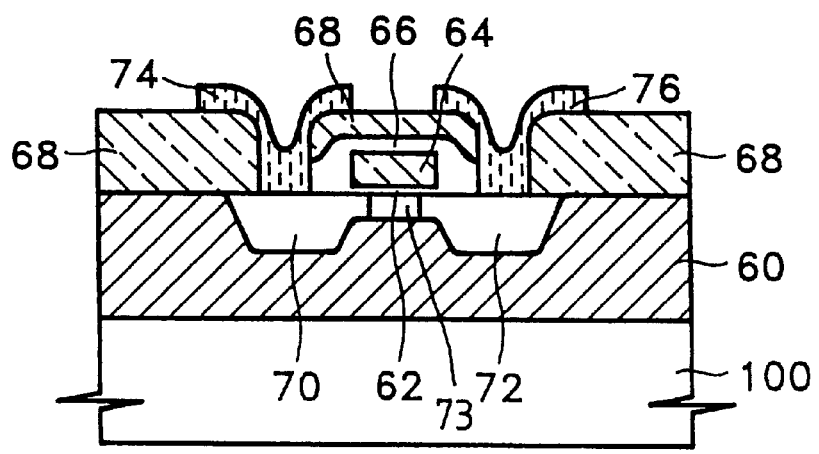

Referring now to FIG. 3F, a semiconductor-on-insulator (SOI) field effect transistor (FET) can be formed in the semiconductor region 40' by forming a gate insulating layer 62 on a face of the semiconductor region 40' and then performing an implant of dopants to adjust threshold voltage. A gate electrode 64 comprising doped polysilicon and tungsten silicide ($WSi_x$) is then preferably formed on the gate insulating layer 62. Next, first conductivity type impurities (e.g. N-type) are implanted using the gate electrode 64 as a mask and diffused to form a source region 70, drain region 72 and channel region 73 therebetween. The channel region 73 may be of second conductivity type (e.g., P-type). An insulating layer 66 is then applied to the gate electrode 64 and followed by the formation of a blanket passivation layer 68 which may comprise boro-phosphorus silicate glass (BPSG). The blanket passivation layer 68 is then planarized using a reflow process and followed by the step of forming source and drain contacts 74 and 76 by opening windows in the insulating layer 66 and passivation layer 68 and then patterning source and drain metallization, using conventional techniques.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor-on-insulator substrate, comprising:
    an electrically insulating layer having a surface thereon and a trench therein having a bottom and opposing sidewalls;
    a semiconductor region that is free of electrically inactive impurities selected from the group consisting of oxygen and nitrogen, in the trench; and
    a mesa insulating region on the bottom of the trench and spaced from the sidewalls thereof, so that a first thickness of the semiconductor region as measured between a top of the mesa and a face of the semiconductor region is less than a second thickness of the semiconductor region as measured between the bottom of the trench and the face of the semiconductor region.

2. The semiconductor-on-insulator substrate of claim 1, wherein said electrically insulating layer and said mesa insulating region comprise silicon dioxide.

3. A semiconductor-on-insulator field effect transistor, comprising:
    an electrically insulating layer having a surface thereon and a trench therein having a bottom and opposing sidewalls;
    a semiconductor region that is free of electrically inactive impurities selected from the group consisting of oxygen and nitrogen, in the trench
    a mesa insulating region on a bottom of the trench and spaced from the sidewalls thereof, so that a first thickness of the semiconductor region as measured between a top of the mesa and a face of the semiconductor region is less than a second thickness of the semiconductor region as measured between the bottom of the trench and the face of the semiconductor region;

an insulated gate electrode on the face of the semiconductor region, said insulated gate electrode extending opposite the top of the mesa insulating region so that a channel region of first conductivity type is defined in a portion of said semiconductor region extending between said insulated gate electrode and said mesa insulating region; and source and drain regions of second conductivity type in the semiconductor region, at opposite ends of the channel region.

4. The field effect transistor of claim 3, wherein said electrically insulating layer and said mesa insulating region comprise silicon dioxide.

5. A semiconductor-on-insulator substrate, comprising:

a handling substrate having a flat surface thereon;

an electrically insulating layer formed on the handling substrate having a flat surface thereon and a trench formed therein having a bottom and opposing sidewalls, wherein the trench has a mesa insulating region on the bottom of the trench and spaced from the sidewalls thereof, so that a first thickness of the insulating region as measured between the top of the mesa and the bottom of the insulating layer is more than a second thickness of the insulating region as measured between the bottom of the trench and the bottom of the insulating layer; and a semiconductor region filled in the trench and planarized together with the insulating layer.

6. The semiconductor-on-insulator substrate of claim 5, wherein the insulating layer comprises silicon dioxide.

7. A semiconductor-on-insulator field effect transistor, comprising:

a handling substrate having a flat surface thereon;

an electrically insulating layer formed on the handling substrate having a flat surface thereon and a trench formed therein having a bottom and opposing sidewalls, wherein the trench has a mesa insulating region on the bottom of the trench and spaced from the sidewalls thereof, so that a first thickness of the insulating region as measured between the top of the mesa and the bottom of the insulating layer is more than a second thickness of the insulating region as measured between the bottom of the trench and the bottom of the insulating layer;

a semiconductor region filled in the trench and planarized together with the insulating layer;

an insulated gate electrode on the face of the semiconductor region, opposite the top of the mesa to thereby define a channel region of first conductivity type extending therebetween; and source and drain regions of second conductivity type in the semiconductor region, at opposite ends of the channel region.

8. The field effect transistor of claim 7, wherein the insulating layer comprises silicon dioxide.

* * * * *